United States Patent [19]

Arase et al.

[11] Patent Number: 5,561,632

[45] Date of Patent: Oct. 1, 1996

[54] NONVOLATILE SEMICONDUCTOR FLASH MEMORY

[75] Inventors: Kenshiro Arase; Akira Nakagawara, both of Kanagawa, Japan

[73] Assignee: Sony Corporation, Tokyo, Japan

[21] Appl. No.: 375,700

[22] Filed: Jan. 20, 1995

[30] Foreign Application Priority Data

Jan. 26, 1994 [JP] Japan ................................. 6-007093
Jun. 7, 1994 [JP] Japan ................................. 6-124892

[51] Int. Cl.$^6$ .................................................. G11C 7/00
[52] U.S. Cl. ............... 365/185.33; 365/200; 365/185.09; 365/185.29; 365/218
[58] Field of Search ................................. 365/218, 200, 365/201, 185.09, 185.22, 185.29, 185.30, 185.33

[56] References Cited

U.S. PATENT DOCUMENTS

| | | | |
|---|---|---|---|
| 5,043,940 | 8/1991 | Harari | 365/218 |
| 5,226,015 | 7/1993 | Gotou et al. | 365/185.09 |
| 5,388,083 | 2/1995 | Assar et al. | 365/185.09 |
| 5,406,529 | 4/1995 | Asano | 365/218 |
| 5,428,569 | 6/1995 | Kato et al. | 365/200 |

*Primary Examiner*—Tan T. Nguyen
*Attorney, Agent, or Firm*—Ronald P. Kananen

[57] ABSTRACT

A flash EEPROM, wherein provision is made of an auxiliary bit portion connecting nonvolatile memories in parallel with bit lines of a memory array portion and a spare row decoder for controlling addresses of a redundant memory portion, which records the cumulative number of cycles of rewriting and erasure for each word line in the nonvolatile memories, judges from the stored cumulative number of cycles if the number of cycles of a sector has reached a limit value, and, when reaching it, replaces the word line with a redundant word line so as to prolong the life of the memory even when the cumulative number of cycles of a specific word line has reached a limit value and which stores the data in accordance with different phases when the number of the data "1" or "0" is greater than or less than a predetermined number at the time of writing data and fetches the stored information based on the phase information at the time of reading data so as to reduce the drain disturbances.

4 Claims, 16 Drawing Sheets

FIG. 10

|  | MEMORY CELL DATA=1 | MEMORY CELL DATA=0 | AUX. MEMORY CELL |
|---|---|---|---|
| NORMAL PHASE | $V_{TH} > 5V$ | $V_{TH} \simeq 1\sim 2V$ | $V_{TH} > 5V$ |
| INVERTED PHASE | $V_{TH} \simeq 1\sim 2V$ | $V_{TH} > 5V$ | $V_{TH} \simeq 1\sim 2V$ |

FIG. 11

| PHASE | WRITE OPERATION | SWL | SBL |
|---|---|---|---|
| NORMAL | WRITE DATA=1 | 12V | 7V |
| NORMAL | WRITE DATA=0 | 12V | 0V |
| NORMAL | WRITE PHASE DATA | 12V | 7V |
| INVERTED | WRITE DATA=1 | 12V | 0V |
| INVERTED | WRITE DATA=0 | 12V | 7V |
| INVERTED | WRITE PHASE DATA | 12V | 0V |

FIG. 12

| READ-CELL | AUX. CELL | JUDGEMENT |
|---|---|---|
| $V_{TH} > 5V$ | $V_{TH} > 5V$ | DATA 1 |
| $V_{TH} \simeq 1 \sim 2V$ | $V_{TH} > 5V$ | DATA 0 |
| $V_{TH} > 5V$ | $V_{TH} \simeq 1 \sim 2V$ | DATA 0 |
| $V_{TH} \simeq 1 \sim 2V$ | $V_{TH} \simeq 1 \sim 2V$ | DATA 1 |

17-1 (17-2)

5,561,632

NONVOLATILE SEMICONDUCTOR FLASH MEMORY

BACKGROUND OF THE INVENTION

1. Field of the Invention

The present invention relates to an electrically programmable nonvolatile memory, for example, a flash electrically erasable programmable read only memory (EEPROM) or other semiconductor nonvolatile memory.

2. Description of the Related Art

Flash EEPROMs for judging the "1" or "0" state of data caused by injection of electrons in floating gates, for example, have conventionally been classified into the ordinary NOR type, divided bit-line NOR (DINOR) type, NAND type, etc.

In such a NOR type, DINOR type, and NAND type flash EEPROM, a write operation is performed by injecting channel hot electrons (CHE) into a floating gate, while the erase operation is performed by draining the electrons from the floating gate to the source by the Fowler-Nordheim (FN) tunnelling. A method has been proposed for erasing sectors of individual word lines as block units.

FIG. 1 is a circuit diagram showing the bias conditions at the time of word line sector erasure in a NOR type flash EEPROM of the related art.

In FIG. 1, $WL_1$ to $WL_3$ are word lines, $BLS_1$ to $BLS_3$ and $BLD_1$ to $BLD_3$ are bit lines, and $MT_{11}$ to $MT_{33}$ are memory cell transistors.

When performing word line sector erasure in a NOR type flash EEPROM, as shown in FIG. 1, the selected word line $WL_2$ is set to −10 V, the nonselected word lines $WL_1$ and $WL_3$ are set to 0 V, the bit lines $BLS_1$ to $BLS_3$ serving as the common source lines are set to 6 V, the bit lines $BLD_1$ to $BLD_3$ of the drain side are set to a floating level, and the electrons in the floating gate FG of the memory cell transistor $MT_{22}$ are drained.

FIG. 2 is a circuit diagram showing the bias conditions at the time of word line sector erasure in a DINOR type flash EEPROM of the related art.

In FIG. 2, $SL_{11}$ to $SL_{21}$ are selection gate lines, $WL_{11}$ to $WL_{18}$ and $WL_{21}$ to $WL_{28}$ are word lines, $MBL_{11}$ and $MBL_{12}$ are main bit lines, $SBL_{11}$, $SBL_{12}$, $SBL_{21}$, and $SBL_{22}$ are sub-bit lines, $SRL_{11}$, $SRL_{12}$, $SRL_{21}$, and $SRL_{22}$ are common source lines, $ST_{11}$, $ST_{12}$, $ST_{21}$, and $ST_{22}$ are selection gate transistors, and $MT_{111}$ to $MT_{118}$, $MT_{121}$ to $MT_{128}$, $MT_{211}$ to $MT_{218}$, and $MT_{221}$ to $MT_{228}$ are memory cell transistors.

When performing word line sector erasure in a DINOR type flash EEPROM, as shown in FIG. 2, the selection gate lines $SL_{11}$ and $SL_{21}$ are set to 0 V, the selected word lines $WL_{11}$ to $WL_{18}$ are set to 15 V, the nonselected word lines $WL_{21}$ to $WL_{28}$ are set to 0 V, the main bit lines $MBL_{11}$ and $MBL_{12}$ are set to a floating level, and the common source lines $SRL_{11}$, $SRL_{12}$, $SRL_{21}$, and $SRL_{22}$ are set to −6 V. Electrons are injected into the floating gates of the memory cell transistors $MT_{111}$ to $MT_{118}$ and $MT_{121}$ to $MT_{128}$.

FIG. 3 is a circuit diagram showing the bias conditions at the time of word line sector erasure in a NAND type flash EEPROM of the related art.

In FIG. 3, $SL_{11}$, $SL_{12}$, $SL_{21}$, and $SL_{22}$ are selection gate lines, $WL_{11}$ to $WL_{18}$, and $WL_{21}$ to $WL_{28}$ are word lines, $BL_{11}$ and $BL_{12}$ are bit lines, $ST_{111}$, $ST_{112}$, $ST_{121}$, $ST_{122}$, $ST_{211}$, $ST_{212}$, $ST_{221}$, and $ST_{222}$ are selection gate transistors, and $MT_{111}$ to $MT_{118}$, $MT_{121}$ to $MT_{128}$, $MT_{211}$ to $MT_{218}$, and $MT_{221}$ to $MT_{228}$ are memory cell transistors.

When performing word line sector erasure in a NAND type flash EEPROM, as shown in FIG. 3, the selection gate lines $SL_{11}$, $SL_{12}$, $SL_{21}$, and $SL_{22}$ are set to 0 V, the selected word lines $WL_{11}$ to $WL_{18}$ are set to −15 V, the nonselected word lines $WL_{21}$ to $WL_{28}$ are set to 0 V, the bit lines $BL_{11}$ and $BL_{12}$ are set to a floating level, and the substrate is set to 6 V. The electrons in the floating gates connected to the selected word lines are drained.

In such flash EEPROMs able to perform word line sector erasure, it is possible to perform rewriting and erasure in the very advantageous so-called "page mode".

Flash EEPROMs are able to perform such word line sector erasure, however, suffer from several problems.

That is, if performing rewriting or erase operations on only a specific word line in the overall memory, the cumulative number of cycles of rewriting and erasure of the word line will reach a certain guaranteed limit before that of the other word lines. That is, the life of the memory as a whole will be determined by the sector of a specific word line which is used most extensively even if the cumulative numbers of cycles of the majority of the word lines remain low.

FIG. 4 is a circuit diagram showing other bias conditions at the time of a write operation in a NOR type flash EEPROM of the related art. Note that the configuration of the circuit is basically the same as that of FIG. 1.

In FIG. 4, $WL_1$, $WL_2$, and $WL_3$ are word lines, $BLS_1$ to $BLS_3$ are bit lines serving as common source lines, $BLD_1$, $BLD_2$, and $BLD_3$ are bit lines, $MT_{11}$ to $MT_{33}$ are memory cell transistors, CG is a control gate, and FG is a floating gate.

When performing an erase operation in this memory array, while not shown, the selected word line $WL_2$ is set to −10 V, the nonselected word lines $WL_1$ and $WL_3$ are set to 0 V, the common source lines $BLS_1$ to $BLS_3$ are set to 6 V, the bit lines $BLD_1$, $BLD_2$, and $BLD_3$ are set to a floating level, and the electrons in the floating gates of the memory cell transistors connected to the selected word line $WL_2$ are drained. Due to this, the threshold voltage $V_{TH}$, of the erased memory cell transistors becomes 1 to 2 V or so.

At the time of a write operation, as shown in FIG. 4, the selected word line, for example, $WL_2$, is set to 12 V, the nonselected word lines $WL_1$ and $WL_3$ are set to 0 V, the common source lines $BLS_1$ to $BLS_3$ are set to the ground level (0 V), the selected bit line $BLD_3$ is set to 7 V, the nonselected bit lines $BLD_1$ and $BLD_3$ are set to 0 V, and channel hot electrons are injected into the floating gate FG of the selected memory transistor $MT_{22}$.

Due to this, the threshold voltage $V_{TH}$ of the selected memory transistor $MT_{22}$ becomes at least 5 V.

In the above-mentioned memory array, however, the data of the nonselected memory cell transistors $MT_{12}$ and $MT_{32}$ connected to the selected bit line $BLD_2$ end up being destroyed by so-called drain disturbance phenomena.

There are two types of drain disturbance phenomena.

The first type of drain disturbance is one which occurs in a nonselected memory cell in which the data "1"(threshold voltage $V_{TH} >5$ V) is stored. The second type of drain disturbance is one which occurs in a nonselected memory cell of the data "0"(threshold voltage $V_{TH} =1$ to 2 V).

The phenomena of drain disturbance will be explained in more detail with reference to the configuration of FIG. 4 as an example.

Suppose that the data "1" and "0" correspond to the "high"(>5 V) and "low"(=1 to 2 V) states of the threshold voltage and take note of the memory cell transistor $MT_{22}$ of FIG. 4. At this time, assuming that the data stored in the memory cell transistors $MT_{12}$ and $MT_{32}$ other than the memory cell transistor $MT_{22}$ connected to the same bit line $BLD_2$ are all "1", when writing data in the memory cell transistor $MT_{12}$ or $MT_{32}$, the electrons built up in the floating gate FG of the memory cell transistor $MT_{22}$ are drained or a hole is injected into the floating gate FG of the memory cell transistor $MT_{22}$.

Accordingly, when the data stored in the memory cell transistor $MT_{22}$ is "1", the storage electrons are lost and the threshold voltage $V_{TH}$ changes to 5 V or more. Despite this, data is written into the nonselected memory cell transistor $MT_{12}$ or $MT_{32}$, so the data stored there ends up being lost.

Further, when the stored data is "0", conversely avalanche hot holes are injected and the threshold voltage $V_{TH}$ is a low 1 to 2 V. Despite this, the voltage further falls. The threshold voltage sometimes falls too much and becomes negative. In such a case, it becomes impossible to correctly read any of the memory cell transistors $MT_{22}$, $MT_{12}$, and $MT_{32}$ connected to the bit line $BLD_2$, regardless of the selection of the cells, since a current flows in the bit line $BLD_2$ at the time of the read operation.

The drain disturbance voltage may be supplied to the memory cell transistors other than the selected memory cell transistor connected to the same bit line a maximum of (N−1) times assuming the number of word lines to be N.

That is, when the stored data of all memory cell transistors other than the selected memory cell transistor connected to the same bit line are "1" then the drain disturbance voltage is applied (N−1) number of times.

Further, in a read only mask ROM, when writing stored data in the manufacturing process, the threshold voltages of the memory cells are made "high" or "low" in accordance with the data "1" or "0" to be stored.

For example, if the memory cells are N-channel MOS transistors, the data is written by injecting ions of a P-type impurity such as boron selectively in the memory cell transistors supposed to store the data "1".

When the data is all "1", a mask is prepared for injecting ions to all the memory cells. This entails preparing data so that the openings in the ion injection mask correspond to the positions where the data "1" is to be written, normally by computer, and fabricating the mask based on this data. In a word, the processing time becomes longer the greater the amount of data.

SUMMARY OF THE INVENTION

A first object of the present invention is to provide a semiconductor nonvolatile memory which enables determination that a cumulative number of cycles of a specific word line has reached a limit value and which enables prolongation of the life of the memory even if the cumulative number of cycles has reached the limit value.

A second object of the present invention is to provide a semiconductor nonvolatile memory which enables a reduction of the drain disturbance and which enables suppression of the lengthening of the time required for fabrication of masks.

To achieve the above first object, there is provided a semiconductor nonvolatile memory which performs word line sector erasure, wherein provision is made of a recording portion for recording the number of cycles of rewriting and erasure for each word line and wherein the cumulative number of cycles of each word line is recorded in the recording portion at each cycle of rewriting and erasure.

Preferably, the recording portion is comprised of a plurality of auxiliary bit lines provided so as to intersect the word lines and a plurality of auxiliary nonvolatile memory cells driven by the auxiliary bit lines and word lines.

Preferably, the number (m) of the auxiliary bit lines and the number (m×number of word lines) of the auxiliary nonvolatile memory cells define the bit length of the cumulative number of cycles recorded.

Preferably, there is further provided at least one redundant word line to which memory cells are connected in parallel and a circuit for cutting off a word line and replacing it by a redundant word line when the cumulative number of cycles of the word line recorded in the recording portion reaches a preset value.

That is, according to the present invention, the number of cycles of rewriting and erasure is recorded for example in the nonvolatile memory cells connected to the auxiliary bit lines of the recording portion every cycle of rewriting and erasure. Further, the cumulative number of cycles recorded in the recording portion is read out and a judgement made as to if the limit number of cycles has been reached in sector units. Further, a word line is cut off and replaced by a redundant word line when the cumulative number of cycles of the word line recorded in the recording portion reaches a preset value.

To achieve the second object, there is provided a semiconductor nonvolatile memory comprising a nonvolatile memory array provided with a plurality of word lines and a plurality of bit lines and having a plurality of semiconductor nonvolatile memory cells arranged in a matrix and an auxiliary memory means for storing the "phase" of information, defined later, for each bit line of the nonvolatile memory array.

Preferably, the nonvolatile memory array is divided into a plurality of sub-arrays in the direction of extension of the bit lines, each sub-array has sub-bit lines and a switching means for operatively connecting the sub-bit lines and the bit lines, and the auxiliary memory means has a means for storing the phase of the stored information for each sub-bit line of the sub-array.

Preferably, the semiconductor nonvolatile memory cells are electrically rewritable and provision is made of a circuit which writes binary information in the auxiliary memory means in accordance with whether the stored information was written inverted at the time of writing the stored information in the semiconductor nonvolatile memory cells and which inverts the stored information in accordance with information of the auxiliary memory means when reading the stored information of the semiconductor nonvolatile memory cells.

Preferably, the semiconductor nonvolatile memory cells can be written with stored information by a mask pattern in the semiconductor fabrication process and provision is made of a circuit which writes binary information in the auxiliary memory means in accordance with whether the stored information was written inverted at the time of writing the stored information in the semiconductor nonvolatile memory cells and which inverts the stored information in accordance with information of the auxiliary memory means when reading the stored information of the semiconductor nonvolatile memory cells.

That is, according to the present invention, the phase of the information stored in the nonvolatile memory array is stored in an auxiliary memory means for each bit line of the nonvolatile memory array. Further, when the nonvolatile memory array is divided into a plurality of sub-arrays in the direction of extension of the bit lines, the phase of the stored information is stored in the memory means for each sub-bit line of the sub-arrays. Still further, when the semiconductor nonvolatile memory cells are electrically rewritable or when the semiconductor nonvolatile memory cells have the stored information written into them in the process of semiconductor fabrication by a mask pattern, binary information is written into the auxiliary memory means in accordance with whether the stored information was written inverted when writing the stored information in the semiconductor nonvolatile memory cells. Further, when reading the stored information from the semiconductor nonvolatile memory cells, the stored information is inverted in accordance with the information in the auxiliary memory means.

BRIEF DESCRIPTION OF THE DRAWINGS

These and other objects and features of the present invention will become clearer from the following description of preferred embodiments with reference to the accompanying drawings, in which:

FIG. 10 is a view for explaining the threshold voltage of a memory cell and auxiliary memory cell at the time of normal phase and inverted phase writing of data of the circuit of FIG. 8;

FIG. 11 is a view of the voltage setting at the time of writing data in the circuit of FIG. 8;

FIG. 12 is a view for explaining the operation for judgement of data at the time of a read operation of the circuit of FIG. 8;

DESCRIPTION OF THE PREFERRED EMBODIMENTS

Preferred embodiments of the present invention will be explained in detail below with reference to the drawings.

Figure 1:
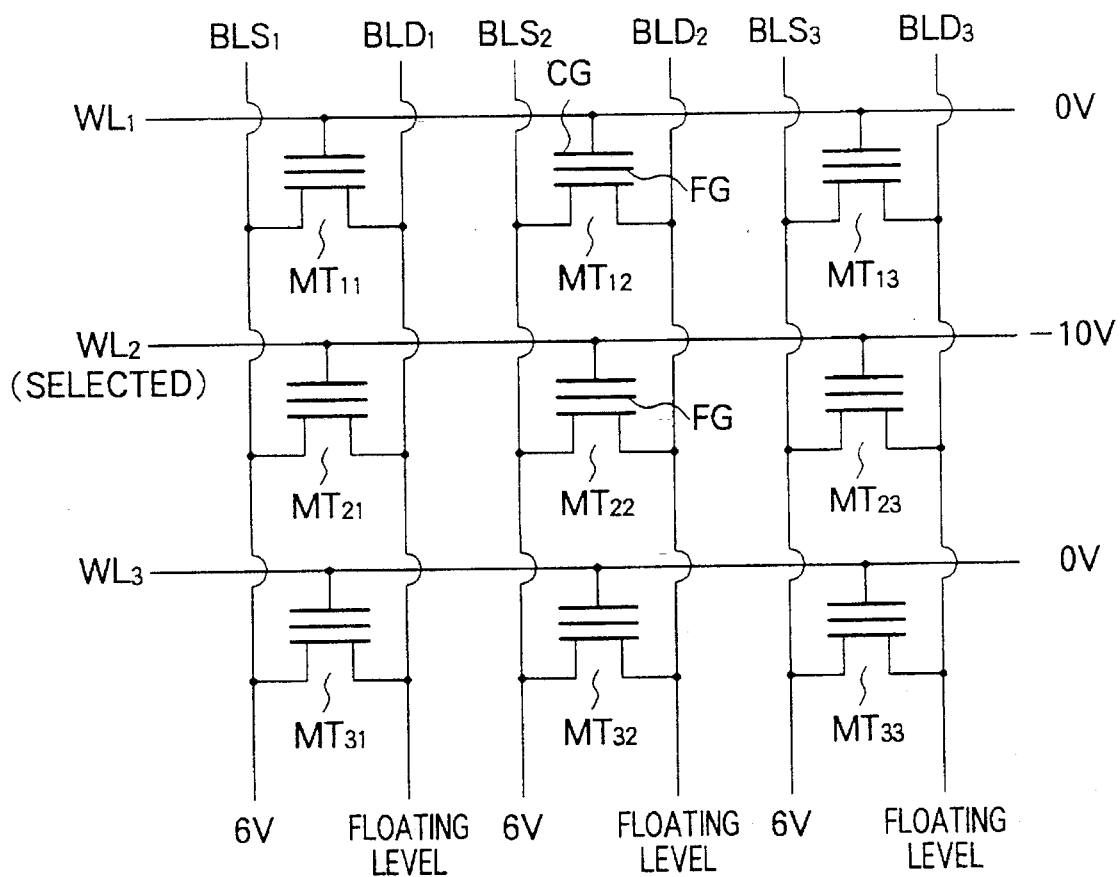
FIG. 1 is a circuit diagram showing the bias conditions at the time of word line sector erasure in a NOR type flash EEPROM of the related art.
Figure 2:
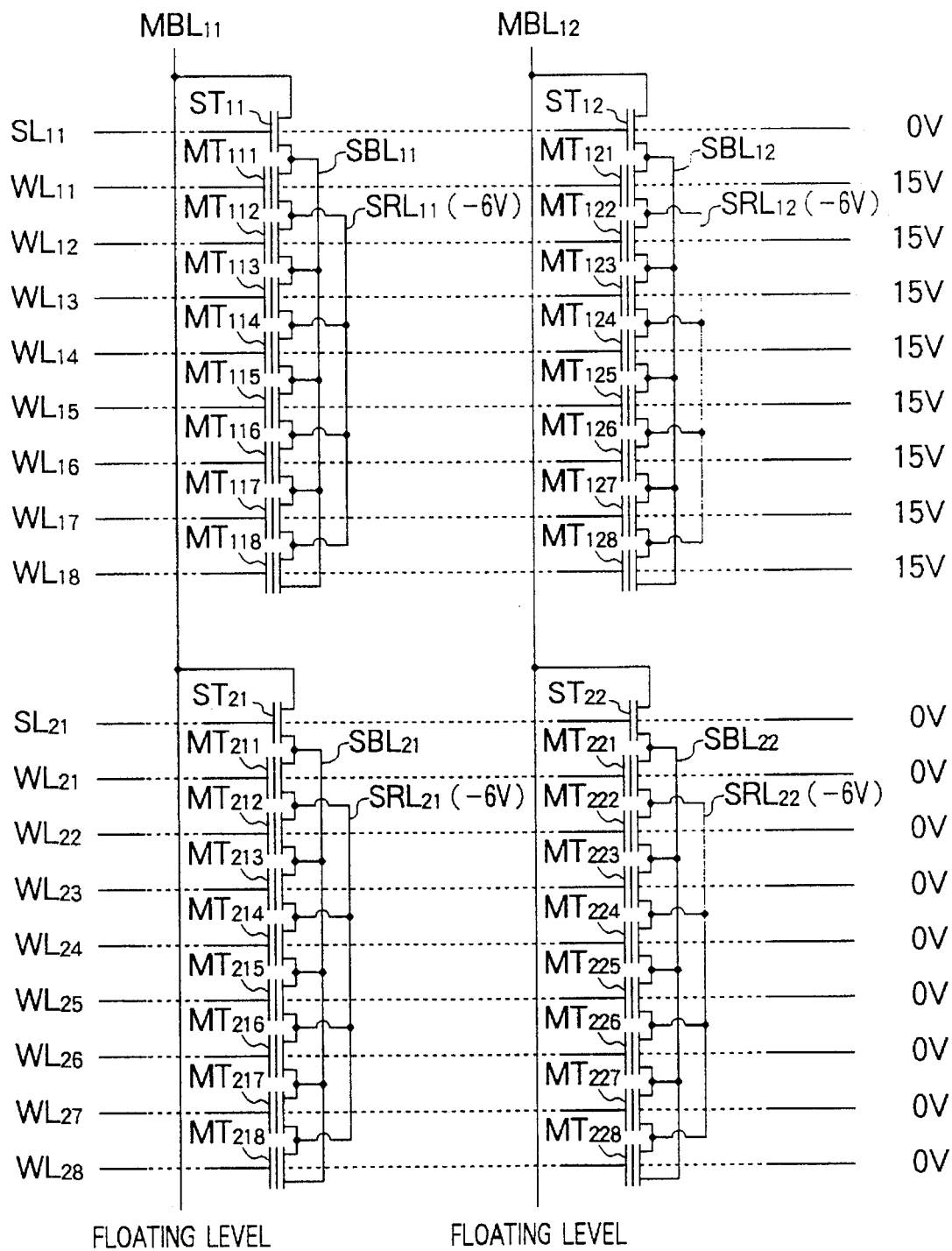
FIG. 2 is a circuit diagram showing the bias conditions at the time of word line sector erasure in a DINOR type flash EEPROM of the related art.
Figure 3:
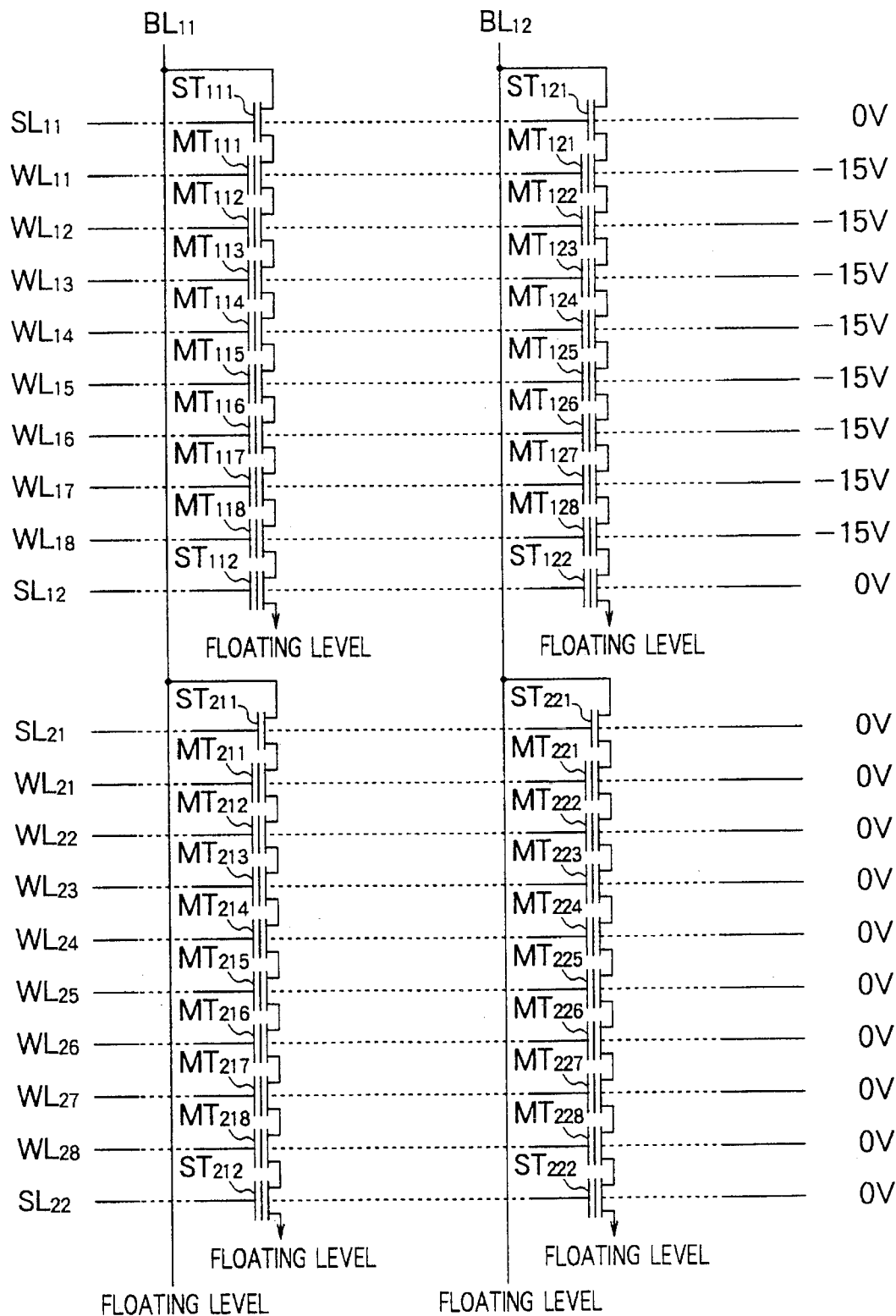
FIG. 3 is a circuit diagram showing the bias conditions at the time of word line sector erasure in a NAND type flash EEPROM of the related art.
Figure 4:
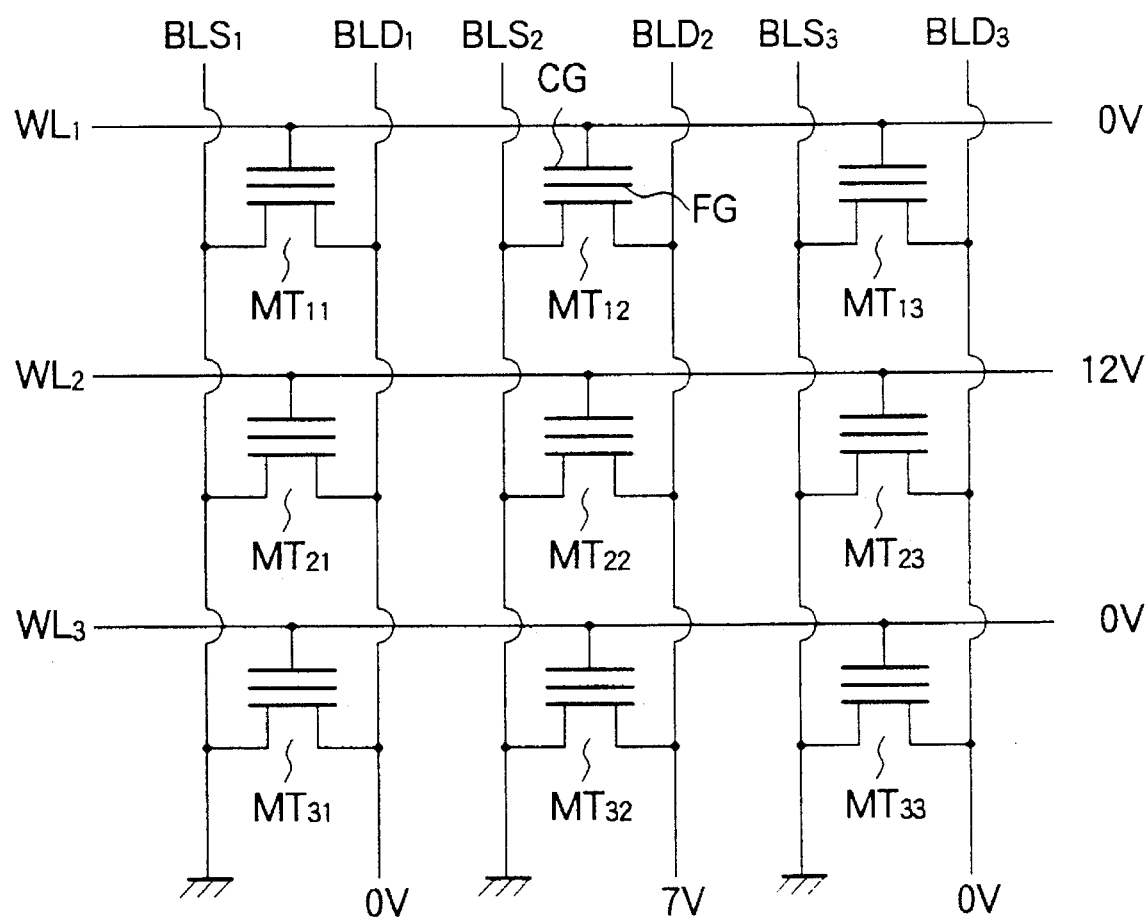
FIG. 4 is a circuit diagram showing the other bias conditions at the time of a write operation of the NOR type flash EEPROM shown in FIG. 1.
Figure 5:
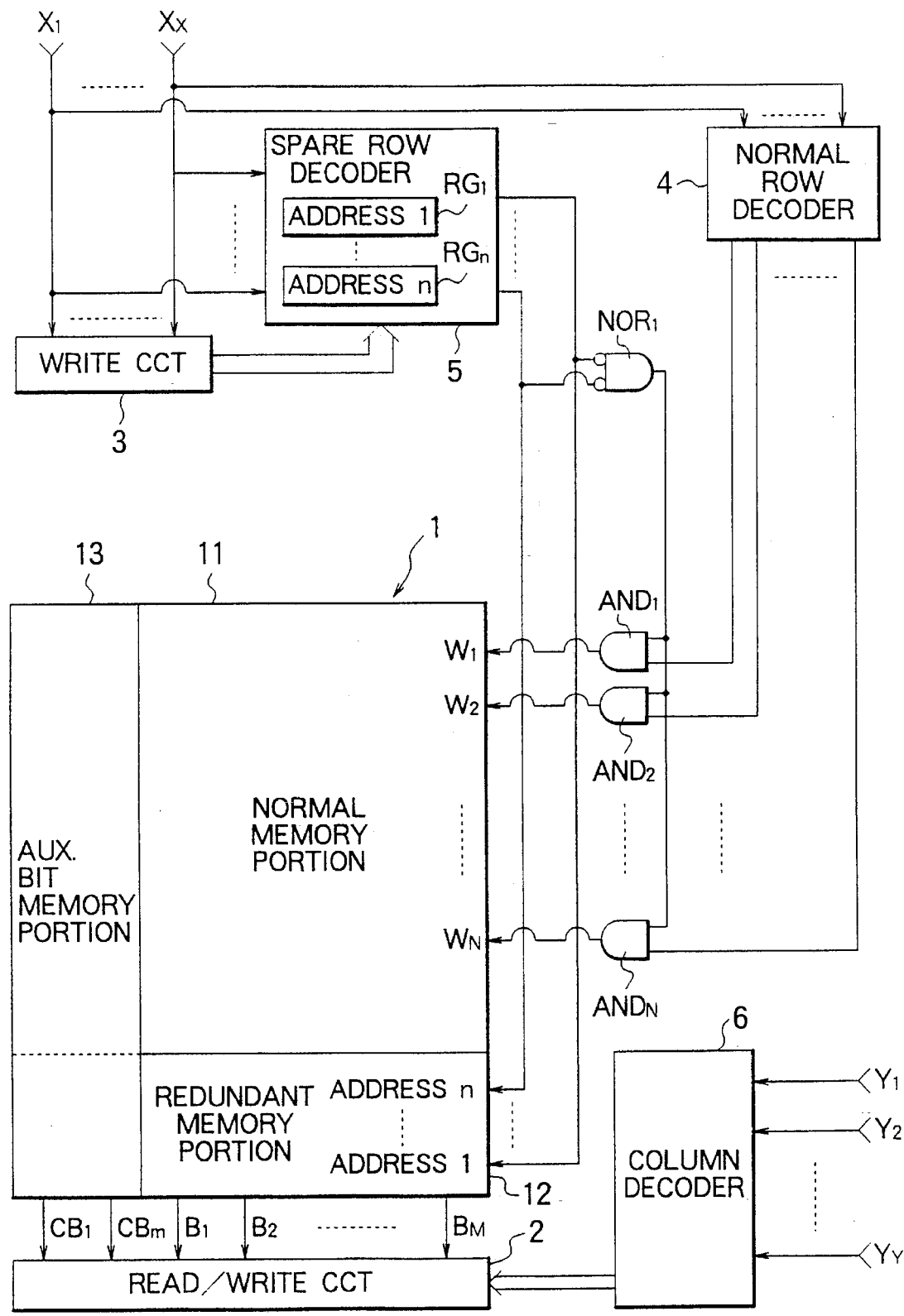
FIG. 5 is a block diagram of a first embodiment of a semiconductor nonvolatile memory according to the present invention.

FIG. 5 is a block diagram of a first embodiment of the semiconductor nonvolatile memory according to the present invention. This embodiment is explained with reference to the example of a NOR type flash EEPROM which is written by channel hot electron and is erased by Fowler-Nordheim (FN) tunneling.

In FIG. 5, 1 is a memory array portion, 2 is a read/write circuit, 3 is a write circuit, 4 is a normal row decoder, 5 is a spare row decoder, 6 is a column decoder, $NOR_1$ is a NOR circuit, and $AND_1$ to $AND_N$ are AND circuits.

The memory array portion 1 is comprised of a normal memory portion 11 for performing writing and reading of normal data, a redundant memory portion 12 for replacing defective memory cells in word line units, and an auxiliary bit memory portion 13 for storing the cumulative number of cycles for each word line.

Figure 6:
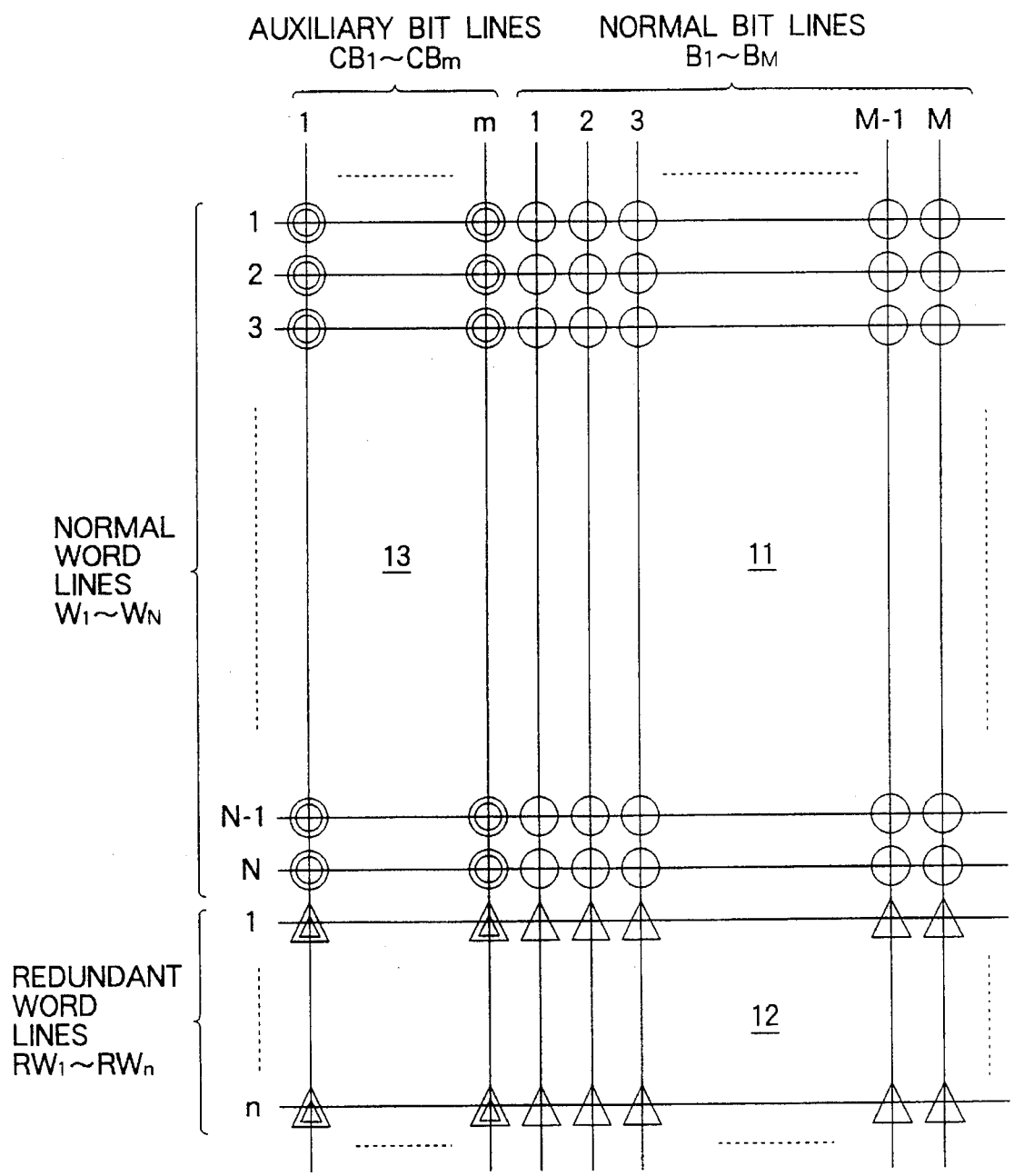
FIG. 6 is a view of an example of the configuration of a memory array portion of FIG. 5.

FIG. 6 is a view of an example of the configuration of the memory array portion 1.

The memory array portion 1, as shown in FIG. 6, is comprised of a normal memory array, comprised of a plurality of memory cells connected to M number of normal bit lines and N number of normal word lines, serving as the normal memory portion 11, plus m number of auxiliary bit lines and n number of redundant word lines.

In FIG. 6, the single-circle marks indicate memory cells on normal word lines, the double-circle marks indicate auxiliary bit memories for storing a cumulative number of cycles, the single-triangle marks indicate memory cells on redundant word lines, and the double-triangle marks indicate auxiliary bit memories for storing a cumulative number of cycles.

In the example of FIG. 6, since provision is made of m number of auxiliary bit lines and m×N number of auxiliary bit memories connected to these auxiliary bit lines, it is possible to store up to a cumulative ($2^{m-1}$) number of cycles. For example, if it is necessary to store up to a cumulative 10,000 number of cycles, then provision is made of m=14 auxiliary bit lines and the auxiliary bit memories connected to the same.

Further, in a DINOR type or NAND type flash EEPROM, in the case of units of eight word lines per sector, for example, since just one-eighth of the number of auxiliary bit lines is sufficient, it is enough to provide two auxiliary bit lines and auxiliary bit memories connected to the same so as to store up to a cumulative 10,000 number of cycles.

In the example of FIG. 6, there are n number of redundant word lines. This number is preferably made the optimal number in consideration of the effect of prolongation of the life of the memory through replacement of defective normal memory cells with redundant memory cells and the area of the memory.

Note that in the case of a DINOR type or NAND type, in the case of units of eight word lines per sector, for example, redundant word lines are similarly provided in units of eight lines.

The read/write circuit 2 performs the normal data read operation and write operation with respect to the memory array portion 1 and also performs the writing and reading of the cumulative number of cycles of the word line sector units recorded in the auxiliary bit memory portion 13 of the memory array portion 1.

The read cumulative number of cycles is sent to a control unit (circuit), not shown, for example, where it is judged if the number has reached a predetermined limit value.

The write circuit 3 receives the row address and, when there is a word line sector in which the cumulative number of cycles has reached the limit value of operation, writes the row address in a predetermined region of the spare row decoder 5.

The normal row decoder 4 receives the row address and outputs it to one of the input terminals of each of the AND circuits $AND_1$ to $AND_N$ so as to send the signal corresponding to the operating mode to the word lines.

The output terminals of the AND circuits $AND_1$ to $AND_N$ are connected to the word lines $W_1$ to $W_N$ of the normal memory portion 11 of the memory array portion 1. Further, the other input terminals of the AND circuits $AND_1$ to $AND_N$ are all connected to the output terminal of the NOR circuit $NOR_1$.

The spare row decoder 5 has n number of row address registers $RG_1$ to $RG_n$ corresponding to the number of the redundant word lines of the redundant memory portion 12 of the memory array portion 1. The write circuit 3 writes the row addresses of the word line sectors in which the cumulative number of cycles has reached the limit value of operation in the row address registers $RG_1$ to $RG_n$.

The output terminals of the row address registers $RG_1$ to $RG_n$ are connected in parallel to one of the input terminals of the NOR circuit $NOR_1$ and are connected to the redundant word lines $RW_1$ to $RW_n$.

The output level of the row address registers $RG_1$ to $RG_n$ is the normal low ("0") level. When the row address of the word line sector in which the cumulative number of cycles has reached the limit value of operation, it is switched to the high ("1") level.

Figure 7:
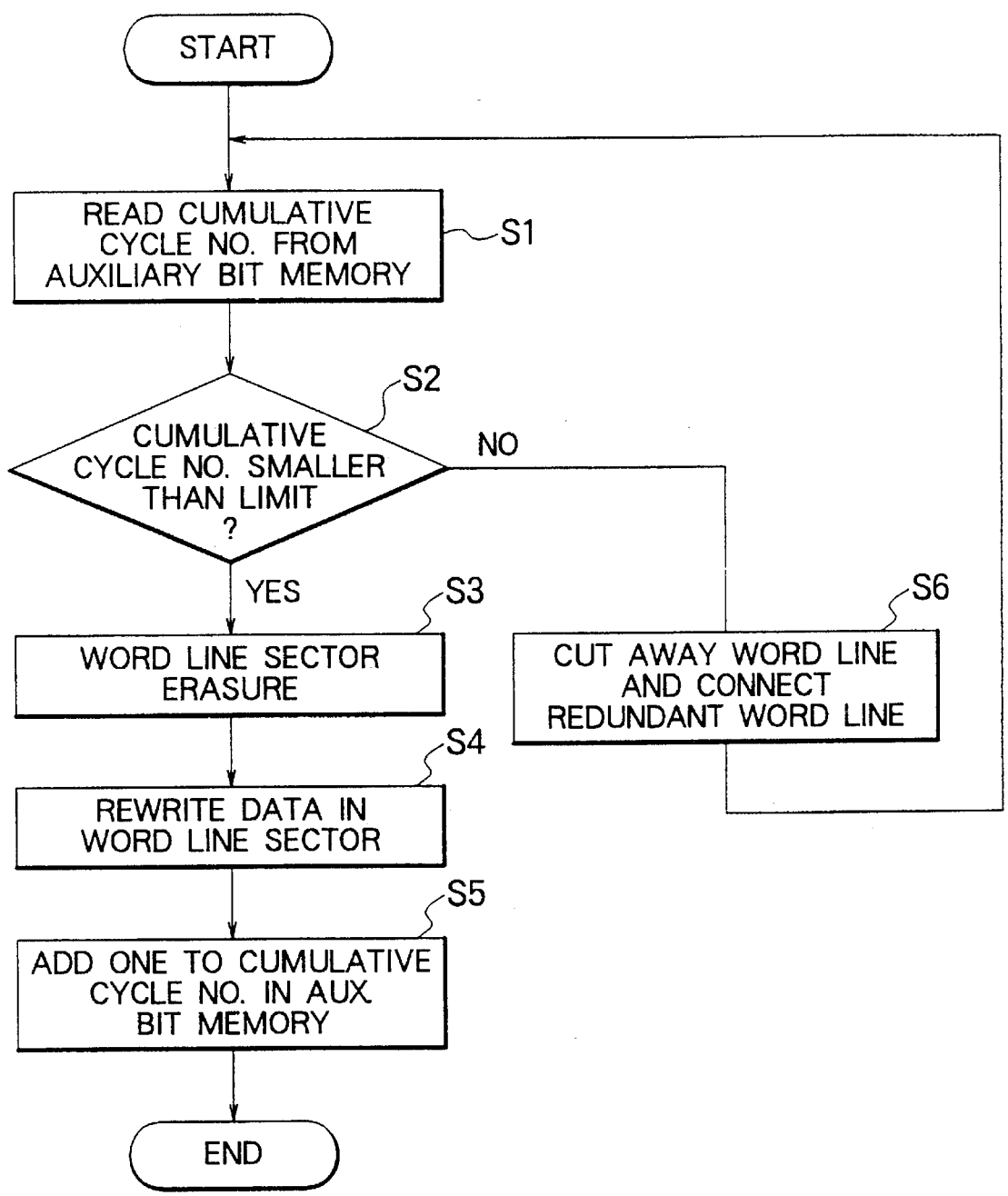
FIG. 7 is a flow chart for explaining the operation of the memory of FIG. 5.

Next, an explanation will be made of the operation of the above configuration with reference to the flow chart of FIG. 7.

First, the cumulative number of cycles is read out from the auxiliary bit memory portion 13 of the memory array 1 and sent to the control circuit, not shown (S1).

In the control circuit, judgement is performed as to if the read cumulative number of cycles is less than a predetermined limit value (S2).

If the result of the judgement at step S2 is yes, then no write operation is performed at the row address at the spare row decoder 5 by the write circuit 2, so the outputs of the registers $RG_1$ to $RG_n$ of the spare row decoder 5 become all the low level. Due to this, the output of the NOR circuit $NOR_1$ becomes the high level and is input to the other input terminals of the AND circuits $AND_1$ to $AND_N$, whereby the AND circuits $AND_1$ to $AND_N$ become active in state.

Accordingly, in this case, the predetermined word lines $W_1$ to $W_n$ of the normal memory portion 11 of the memory array portion 1 are accessed through the normal row decoder 4. First, word line sector erasure is performed (S3), then the data in the word line sector is rewritten (S4).

After the data is rewritten in the word line sector, a write operation is performed on the nonvolatile memory connected to the predetermined auxiliary bit line CB of the auxiliary bit memory portion 13 of the memory array portion 1. That is, the cumulative number of cycles of the sector is incremented by "1"(S5).

On the other hand, at step S2, when a negative result of judgement is obtained, an operation is performed to write the load address at a predetermined register of the spare row decoder 5 by the write circuit 2. As a result, the output of the register in which the row address of the spare row decoder 5 is written becomes the high level. Due to this, the output of the NOR circuit $NOR_1$ is switched from the high level to the low level and is input to the other input terminals of the AND circuits $AND_1$ to $AND_N$. Therefore, the AND circuits $AND_1$ to $AND_N$ become inactive in state and the predetermined word lines $W_1$ to $W_n$ of the normal memory portion 11 of the memory array portion are not accessed through the normal row decoder 4. That is, the word line is cut off and is replaced by the redundant word line connected to the register in which the row address is written (S6).

After this, the operations for word line sector erasure, rewriting and reading of data, and writing and reading of the cumulative number of cycles are performed on the redundant word line switched to instead of the word line for which the cumulative number of cycles has reached the limit value.

As explained above, according to the fourth embodiment, there is provided a flash EEPROM which performs word line sector erasure, wherein provision is made of auxiliary bit lines, to which nonvolatile memories are connected, in parallel to the bit lines of the normal memory portion 11 of the memory array portion 1, the cumulative number of cycles of rewriting and erasure is recorded in the nonvolatile memories for each word line, it is discriminated from the recorded cumulative number of cycles if the number of cycles of the sector has reached a limit value, and, when it has reached it, the word line is replaced with a redundant word line, so it is possible to determine when a specific cumulative number of cycles has reached the limit value and thereby possible to obtain a grasp of the state of use of the memory array and enable even access.

Further, since there is a redundant portion, it is possible to extend the life of the memory even if the cumulative number of cycles of a certain specific word line has reached a limit value.

AS a result, there is the advantage that the reliability of the memory as a whole can be vastly improved.

Figure 8:
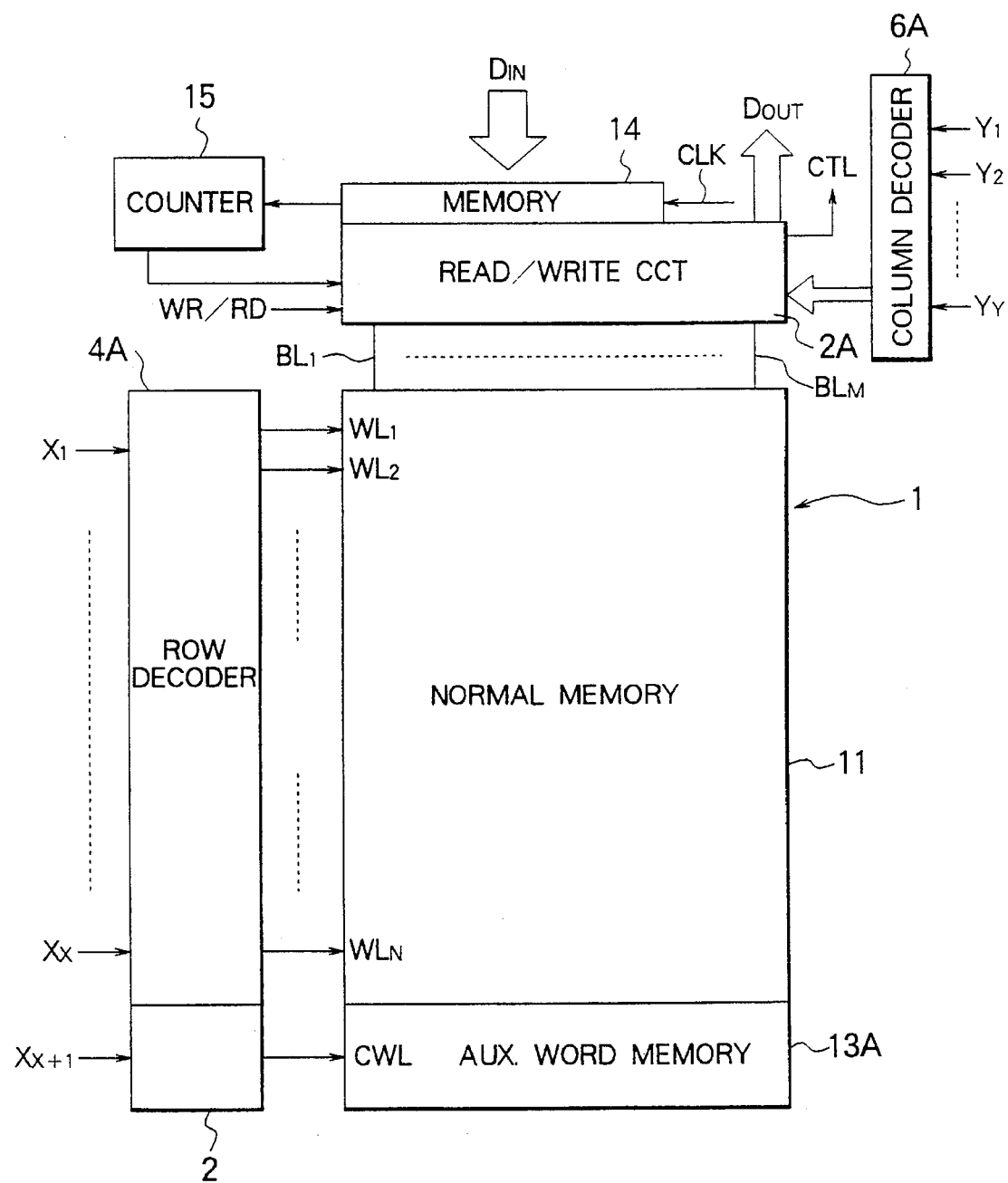
FIG. 8 is a block diagram of a second embodiment of a semiconductor nonvolatile memory according to the present invention.

FIG. 8 is a block diagram of a second embodiment of a semiconductor nonvolatile memory according to the present invention.

In FIG. 8, 1 is a memory array portion, 4A a row decoder, 6A a column decoder, 14 a memory circuit, 15 a counter circuit, 2A a write/read circuit, $WL_1$ to $WL_N$ word lines, $BL_1$ to $BL_M$ bit lines, and CWL an auxiliary word line.

The memory array portion 1 is comprised of a normal memory portion 11 with respect to which normal writing and reading of data are performed and an auxiliary word memory portion 13A on which the phase at the time of writing the data is recorded for every bit line.

Figure 9:
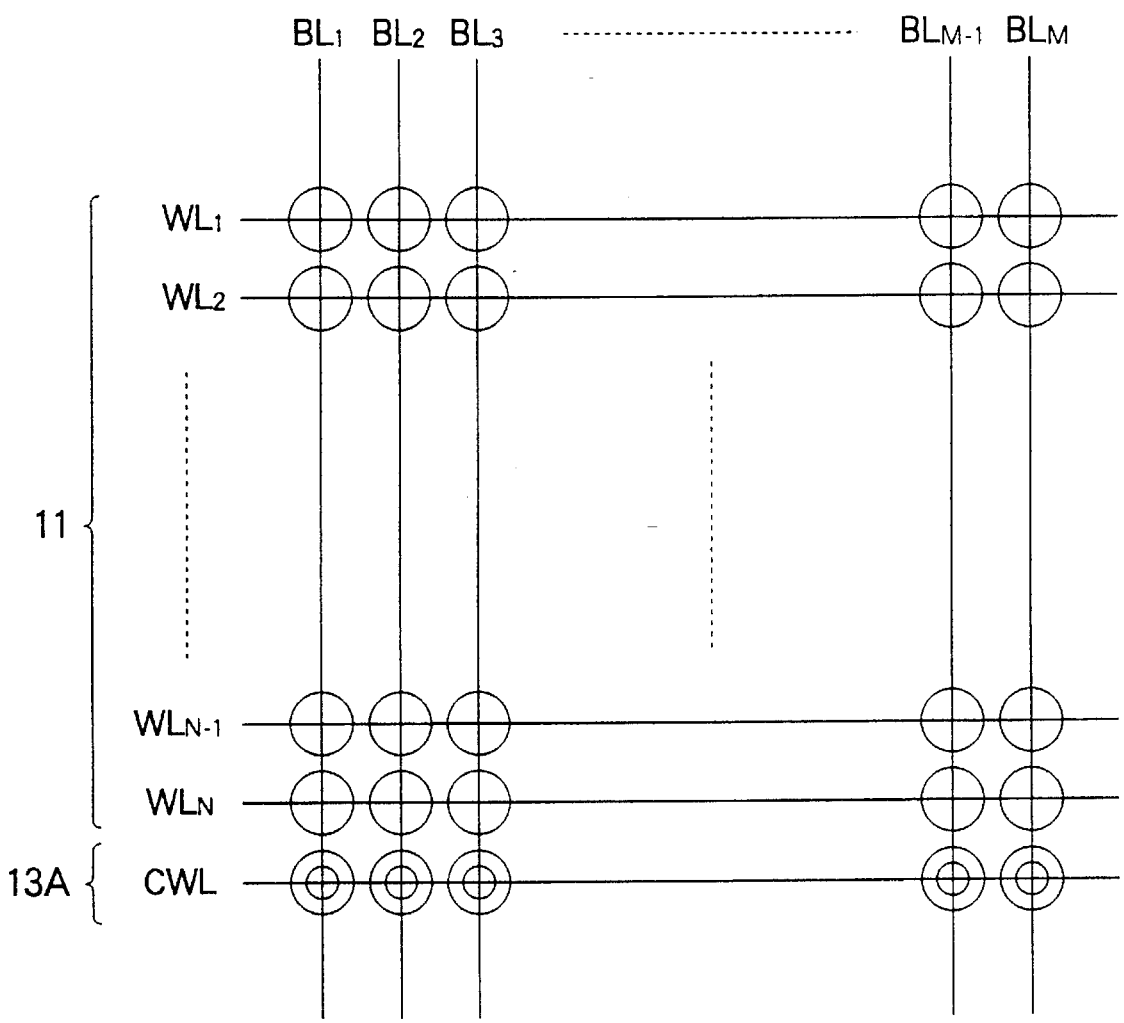
FIG. 9 is a view of an example of the configuration of a memory array portion in FIG. 8.

FIG. 9 is a more detailed view of an example of the configuration of the memory array portion 1.

The memory array portion 1, as shown in FIG. 9, is comprised of a normal memory array comprised of a plurality of memory cells connected to N number of word lines $WL_1$ to $WL_N$ and M number of bit lines $BL_1$ to $BL_M$ serving as the normal memory portion plus a single auxiliary word line CWL.

In FIG. 9, the single-circle marks indicate memory cells on the normal word lines and the double-circle marks indicate auxiliary word memories for storing the phase state of each word line sector.

The row decoder 4A selects the word lines WL designated by the row addresses $X_1$ to $X_x$, supplies a signal of a level in accordance with the mode of operation to the selected word lines WL, and supplies a signal of a level in accordance with the mode of operation based on the control of the write/read circuit 2A to the auxiliary word line CWL designated by the address $X_{x+1}$.

The column decoder 6A outputs a signal for selecting the bit line designated by the column addresses $Y_1$ to $Y_Y$ to the write/read circuit 2A.

The memory circuit 14 for example has a structure of N×M number of SRAMs or DRAMs arranged in an N×M matrix, holds the input data $D_{IN}$ input corresponding to the M number of bit lines $BL_1$ to $BL_M$ of the normal memory portion 11 at the time of a write operation, and successively outputs to the counter 15 the N number (corresponding to number of word lines) of held data for each bit line in accordance with a predetermined clock signal CLK.

The counter circuit 15 counts just the data "1" in the N number of data "0" and "1" output from the memory circuit 14. Further, for example, the most significant bit (MSB) output is connected to the write/read circuit 2A.

The most significant bit of the counter circuit 15 becomes the logic "1" when the number of memory cells (corresponding to number of word lines) in which the data "1" is written out of the memory cells connected to a certain bit line reaches one/half of the number N of word lines, that is, N/2, for example. This information is held in a register, not shown, of the write/read circuit 2A and is referred to at the time of a write operation.

When receiving a write command WR from a not shown control circuit and the information held in the above not shown register shows that the output data of the most significant bit of the counter circuit 15 is "0", the write/read circuit 2A writes the data in same phase as with a normal NOR type flash EEPROM, that is, in the normal phase, sends a control signal CTL showing that fact to the not shown row decoder control circuit, and writes the data "1" showing that the data was recorded at a normal phase in the auxiliary word memory cell provided corresponding to the selected bit line.

As opposed to this, when the information held in the not shown register shows that the output data of the most significant bit of the counter circuit 15 is "1", the write/read circuit 2A writes the data in reversed phase, sends a control signal CTL showing that fact to the not shown row decoder control circuit, and writes the data "0" showing that the data was recorded in reversed phase in the auxiliary word memory cell provided corresponding to the selected bit line.

Further, when receiving a read command RD, the write/read circuit 2A outputs the control signal CTL to the not shown row decoder control circuit, performs a read operation on the auxiliary memory cell of the auxiliary word memory portion 12 to confirm the phase of the write data, then performs a read operation on the memory cells of the normal memory portion 11 whose addresses were designated and judges if the data is "1" or "0" based on the read phase information.

Next, a detailed explanation will be made of the principle of the operation at the time of writing and reading data in the write/read circuit 2A while referring to FIG. 10 to FIG. 12.

In this embodiment, as apparent from the above, the concept of the "phase" of data is introduced to the memory cells of the bit lines. For example, the write/read circuit 2A decides on the phase for each bit line as shown in FIG. 10 and writes the data accordingly.

That is, a "normal phase" is the phase in same as with the normal NOR type flash EEPROM. When the threshold voltage $V_{TH}$ of a memory cell is 5 V or more and the cell is OFF in state, the data is "1", while when the threshold voltage $V_{TH}$ is i to 2 V and the cell is ON in state, the data is "0". As opposed to this, an "reversed phase" is the phase inverted from that of the normal NOR type flash EEPROM. When the threshold voltage $V_{TH}$ of the memory cell is 1 to 2 V and the cell is ON in state, the data is "1", while when the threshold voltage $V_{TH}$ is 5 V or more and the cell is OFF in state, the data is "0".

The phase of the data of the memory cells of each of the bit lines is normal when the threshold voltage $V_{TH}$ of the memory cell in the auxiliary bit memory portion 13A is 5 V or more and the cell is OFF in state and is inverted when the threshold voltage $V_{TH}$ of the memory cell is 1 to 2 V and the cell is ON in state.

When writing data, it is sufficient to perform the write operation by setting the phase of each of the bit lines so that the number of times of occurrence of drain disturbance becomes smaller.

This may be done by setting the phase of each of the bit lines so that the number of memory cells where the threshold voltage $V_{TH}$ is 5 V or more and the cells are OFF in state, becomes less than half of the total, i.e., N/2, where the total number of the word lines is N, as in the present embodiment.

That is, when writing data, it is sufficient if the number of memory cells in which channel hot electrons are injected into the floating gates is made less than half of the total.

Accordingly, the phase of the bit lines is set by the following relationship with the normal phase the same phase as a normal NOR type flash EEPROM, the threshold voltage $V_{TH}$ being 5 V or more, the number of memory cells of the data "1" being P, and the total number of word lines being N, Reversed phase when $P \geq N/2$ Normal phase when $P < N/2$ The voltages applied to the word line SWL and the bit line SBL selected by the row decoder 4A and the write/read circuit 2A at the time of a write operation of data at this time are set as shown in FIG. 11.

That is, regardless of whether the phase is normal or reversed, the selection gate line SWL is set to 12 V. Further, when writing the data "1" at the time of writing data in a normal phase, the selected bit line SBL is set to 7 V and when writing the data "0", the selected bit line BL is set to 0 V. On the other hand, when writing data in reversed phase, when writing the data "1", the selected bit line BL is set to 0 V and when writing the data "0", the selected bit line BL is set to 7 V.

By performing the write operation in the above way, the number of memory cells in which channel hot electrons are injected into the floating gates becomes less than half of the total even in the worst case. That is, it is possible to reduce to a half the frequency of drain disturbance at the time of writing data even in the worst case. Compared with a normal NOR type flash EEPROM, the maximum load is halved.

Further, in a data read operation, as mentioned above, before the read operation on a memory cell, a read operation is performed on the auxiliary memory cell to confirm the phase, then, as shown in FIG. 12, the normal read operation is performed and a judgement made as to if the data read from the memory cells is "1" or "0".

That is, when the threshold voltage $V_{TH}$ of the auxiliary memory cell is 5 V or more and no current is flowing to the bit line BL, it is judged that the phase is normal. In the subsequent read operation, when the threshold voltage $V_{TH}$ of the read cell is 5 V or more and no current flows to the bit line to which the read cell is connected, the read data is judged to be "1".

In a read operation after it is judged that the threshold voltage $V_{TH}$ of the auxiliary memory cell is 5 V or more, no current flows to the bit line BL, and the phase is normal, the read data is judged to be "0" when the threshold voltage $V_{TH}$ of the read cell is 1 to 2 V and current flows to the bit line BL to which the read cell is connected.

Further, when the threshold voltage $V_{TH}$ of the auxiliary memory cell is 1 to 2 V and current is flowing to the bit line BL, it is judged that the phase is inverted. In the subsequent read operation, when the threshold voltage $V_{TH}$ of the read cell is 5 V or more and no current flows to the bit line to which the read cell is connected, the read data is judged to be "0".

In a read operation after it is judged that the threshold voltage $V_{TH}$ of the auxiliary memory cell is 1 to 2v, current flows to the bit line BL, and the phase is reversed, the read data is judged to be "1" when the threshold voltage $V_{TH}$ of the read cell is 1 to 2 V and current flows to the bit line BL to which the read cell is connected.

Next, an explanation will be made of the operation by this configuration.

At the time of writing data, a write command WR is input to the write/read circuit 2A and the M number of data $D_{IN}$ are input successively to the memory circuit 14 and held there.

A clock signal CLK is input to the memory circuit and the held data corresponding to the bit lines are successively output to the counter circuit 15 in accordance with the input of the clock signal.

The counter circuit 15 counts the number of the data "1" in the output of the memory circuit 14. When the result is that the number of the data "1" is less than ½ of the total number N of the word lines, the most significant bit does not become the logic "1" and is input to the write/read circuit 2A as the logic "0". This data is held at a not shown register.

In this case, the write/read circuit 2A judges that the write operation is to be in the normal phase, writes the predetermined data held in the memory circuit in the same phase as the case of a normal NOR type, and writes the data "1" showing the normal phase in the auxiliary word memory cell.

At this time, the word line WL and auxiliary word line CWL selected by the row decoder 4A are set to 12 V, the predetermined bit line $BL_1$ (to $BL_M$) is set to 7 V when writing the data "1" by the write/read circuit 2A, and the predetermined bit line $BL_1$ (to $BL_M$) is set to 0 V when writing the data "0".

The threshold voltage $V_{TH}$ of the memory cell in which the data "1" is written is held at a value of more than 5 V, while the threshold voltage $V_{TH}$ of the memory cells in which the data "0" is written are held at the value of 1 to 2 V.

Similarly, the threshold voltage $V_{TH}$ of the auxiliary word memory cell is held at 5 V or more.

As opposed to this, when, as a result of the count of the counter circuit 15, the number of the data "1"0 is found to be more than ½ of the total number N of the word lines, the most significant bit becomes the logic "1", this is input to the write/read circuit 2A, and the information is held at a not shown register, it is judged that the write operation is one of the reversed phase, the predetermined data held at the memory circuit 14 is written in a reversed phase from the case of a normal NOR type, and writes the data "0" showing the reversed phase in the auxiliary word memory cell.

At this time, the word line WL and auxiliary word line CWL selected by the row decoder 4A are set to 12 V, the predetermined bit line $BL_1$ (to $BL_M$) is set to 0 V when writing the data "1" by the write/read circuit 2A, and the predetermined bit line $BL_1$ (to $BL_M$) is set to 7 V when writing the data "0".

In this case, the threshold voltage $V_{TH}$ of the memory cell with the data "1" written in it is held at the value of 1 to 2 V and the threshold voltage $V_{TH}$ of the memory cell with the data "0" written in it is held at the value of 5v or more.

Further, at the time of reading data, if a read command RD is input to the write/read circuit 2A, before the read operation on the memory cell of the normal memory portion 11, a read operation is performed on the auxiliary memory cell of the auxiliary word memory portion 13A to confirm the phase, then the normal read operation is performed and judgement is made if the data read from the memory cells is "1" or "0" based on the read phase information.

When no current is flowing to the bit line BL connected to the auxiliary memory cell, the data is judged by judging that it is written at the normal phase. When a sufficient current flows in the bit line BL, the data is judged by judging that it is written in a reversed phase.

Specifically, when it is judged that the data was written in a normal phase, the read data is judged to be "1" if no current flows to the bit line to which the read cell is connected, while the read data is judged to be "0" if sufficient current flows to the bit line. As opposed to this, when it is judged that the data has been written in a reversed phase, the read data is judged to be "1" if sufficient current flows to the bit line to which the read cell is connected, while the read data is judged to be "0" if no current flows to the bit line.

As explained above, according to the second embodiment, when writing data, if the number of word lines in which the data "1" is to be written by the write/read circuit 2A is less than one-half of the total number N of word lines, the data is written with the phase of the write data maintained at a normal phase, and the fact that the write operation was performed in a normal phase is recorded in the auxiliary word memory portion 13A serving as the recording portion. When the number of word lines in which the data "1" is to be written is more than N/2, the phase of the write data is inverted to write the data and the fact that write operation was performed at the inverted phase is recorded in the auxiliary word memory portion 13A. Further, when reading data, first the phase information of the time of writing of the data in the memory cells, recorded in the auxiliary word memory portion 13A, is read out, then a read operation is performed on the memory cells of the normal memory portion 11 and it is judged based on the phase information read out if the read data is "1" or "0". Therefore, there are the advantages that it is possible to vastly reduce to less than half the number of times of occurrence of drain disturbance at the time of writing data and to tremendously improve the resistance to drain disturbance and prevent destruction of data.

Figure 13:
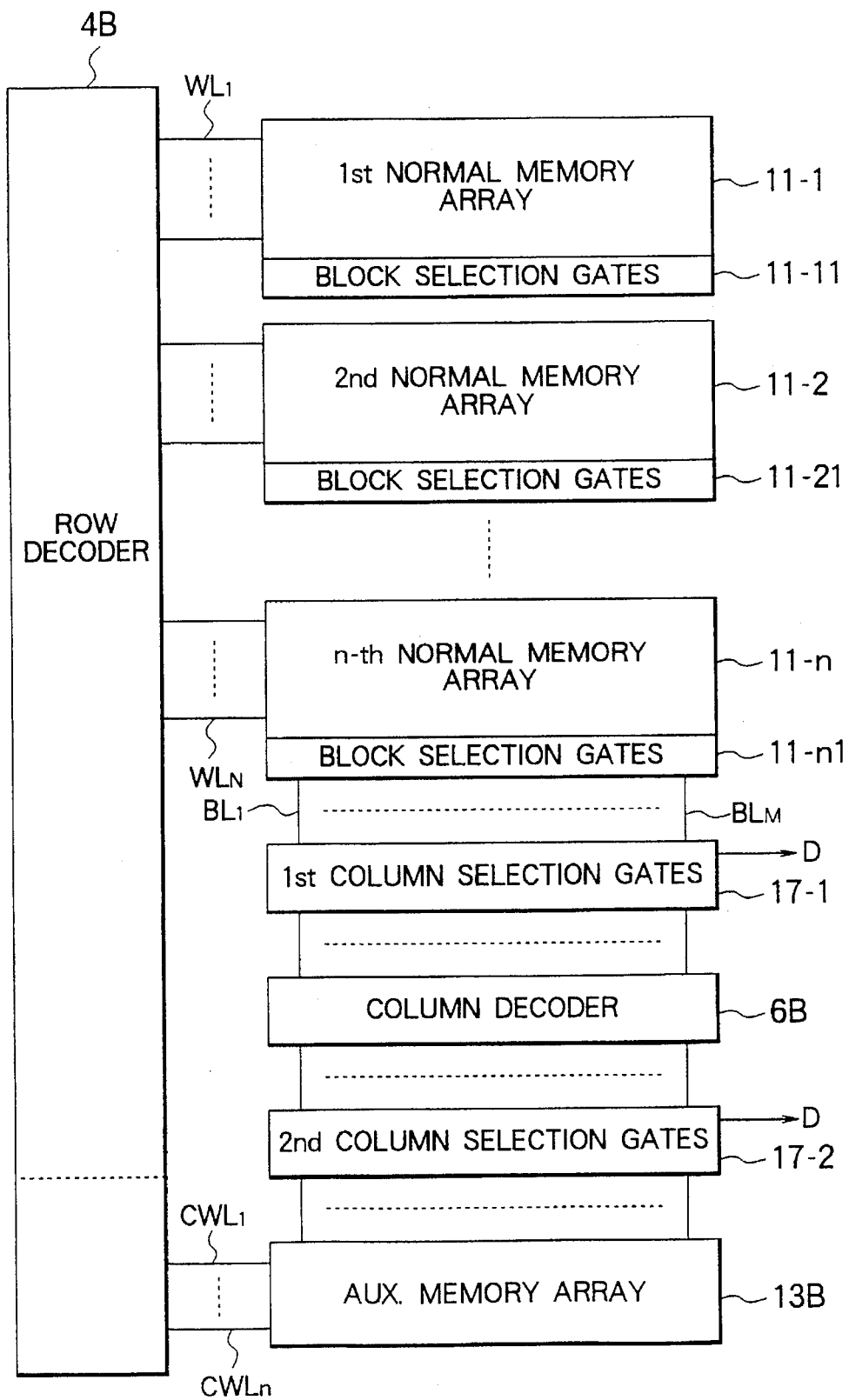
FIG. 13 is a block diagram showing key portions of a third embodiment of a semiconductor nonvolatile memory according to the present invention.

FIG. 13 is a block diagram showing key portions of a NOR type flash EEPROM as a third embodiment of a semiconductor nonvolatile memory according to the present invention.

The point of difference of the third embodiment from the first embodiment explained above is that the normal memory portion of the memory array portion I is divided into the normal memory arrays 11–1 to 11–n comprised of n number of word line groups, each group having one or more word lines, and provision is made of an auxiliary memory array 13B having n number of auxiliary word lines $CWL_{11}$ to $CWL_n$ corresponding to the memory arrays 11-1 to 11-n.

In such a configuration, the normal memory arrays 11- 1 to 11-n are operatively connected to the bit lines $BL_1$ to $BL_M$ by the block selection gates 11-11 to 11-n1 provided corresponding to the same.

Further, between the normal memory array 11-n and column decoder 6B and the column decoder 6B and auxiliary memory array 13B, there are provided respectively a first column selection gate 17-1 and a second column selection gate 17-2. The normal memory array 11-n and column decoder 6B and the column decoder 6B and auxiliary memory array 13B are operatively connected.

The row decoder 4B is connected to the normal memory array 11-1 to 11-n and the auxiliary memory array 13B.

Figure 14:
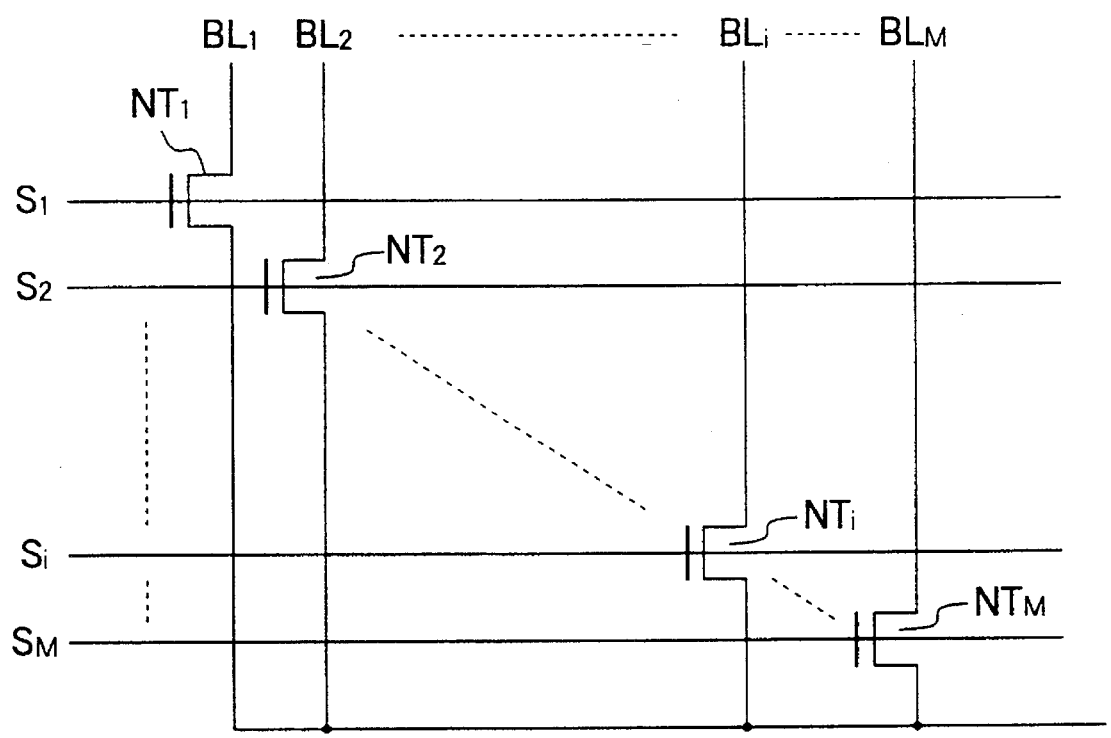
FIG. 14 is a circuit diagram showing a more detailed example of the configuration of column selection gates shown in FIG. 13.

FIG. 14 is a circuit diagram showing a more detailed example of the configuration of the column selection gates 17-1 to 17-2 shown in FIG. 13.

The selection gates are comprised by inserting and connecting the N-channel MOS transistors $NT_1$ to $NT_M$ in the bit lines $BL_1$ to $BL_M$. The gates of the N-channel MOS transistors $NT_1$ to $NT_M$ are connected to the input lines of the control signals $S_1$ to $S_M$.

In this configuration, in each of the normal memory arrays (word line groups) 11-1 to 11-n, phase information of "0" or "1" showing the normal and inverted phase is written in a predetermined auxiliary memory cell connected to the corresponding auxiliary word lines $CWL_1$ to $CWL_n$ of the auxiliary memory array 13B.

According to this embodiment, there is the advantage that it is possible to efficiently and accurately reduce the frequency of drain disturbance.

Note that in the embodiments, the explanation was made of the example of the provision of n number of auxiliary word lines $CWL_{11}$ to $CWL_n$ corresponding to the normal memory arrays 11-1 to 11-n all in the auxiliary memory array 13B, but the invention is not limited to this. Various modifications are possible, for example, it is possible to provide the auxiliary word lines $CWL_{11}$ to $CWL_n$ in close proximity for each of the normal memory arrays 11-1 to 11-n.

Further, in the above embodiments, an explanation was made of the example of a NOR type flash EEPROM, but of course the invention can also be applied to a usual DINOR type flash EEPROM or NAND type flash EEPROM.

Figure 15:
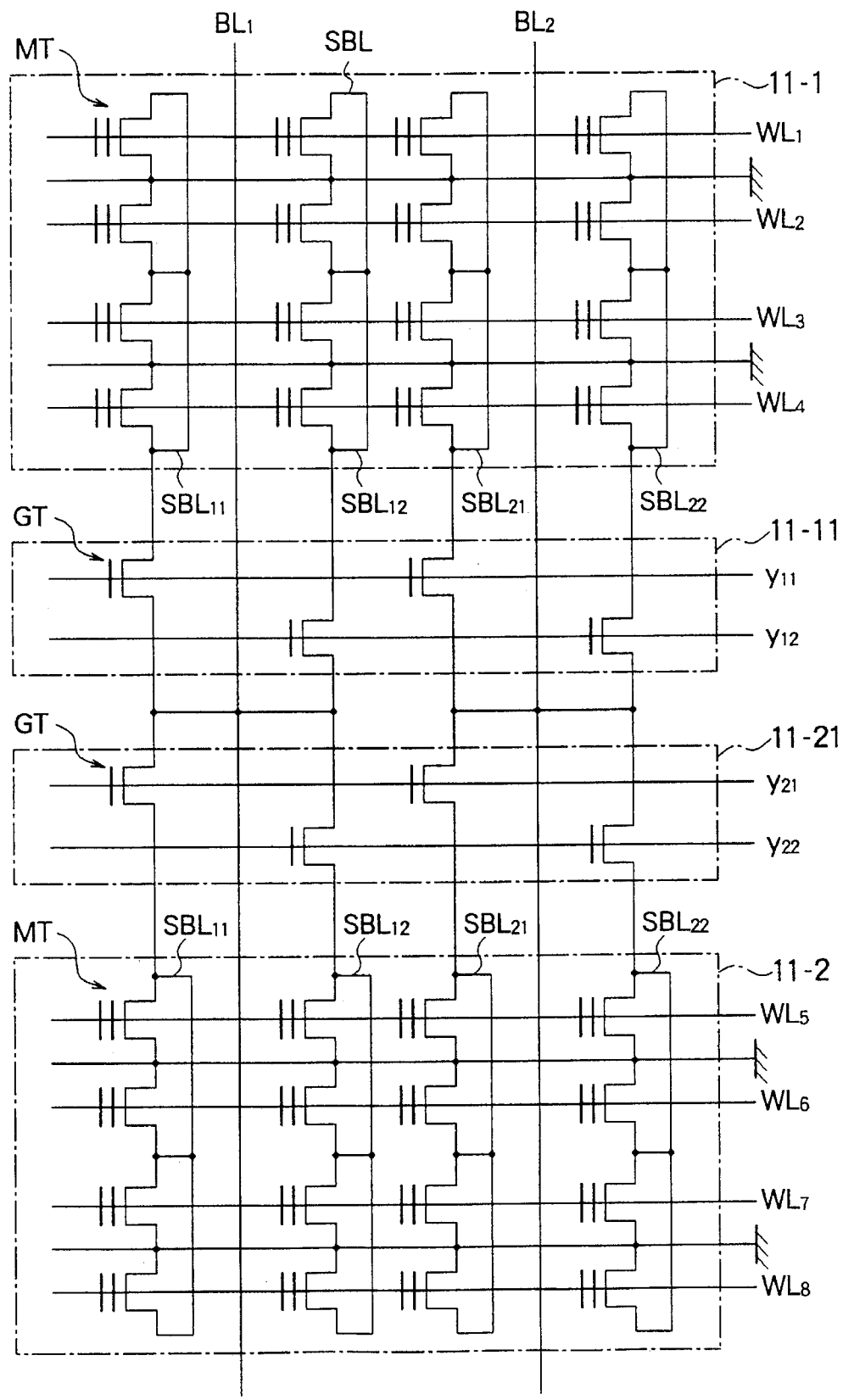
FIG. 15 is a circuit diagram of an example of the configuration of a normal memory array in the case of application of the present invention to a DINOR type flash EEPROM as a fourth embodiment.
Figure 16:
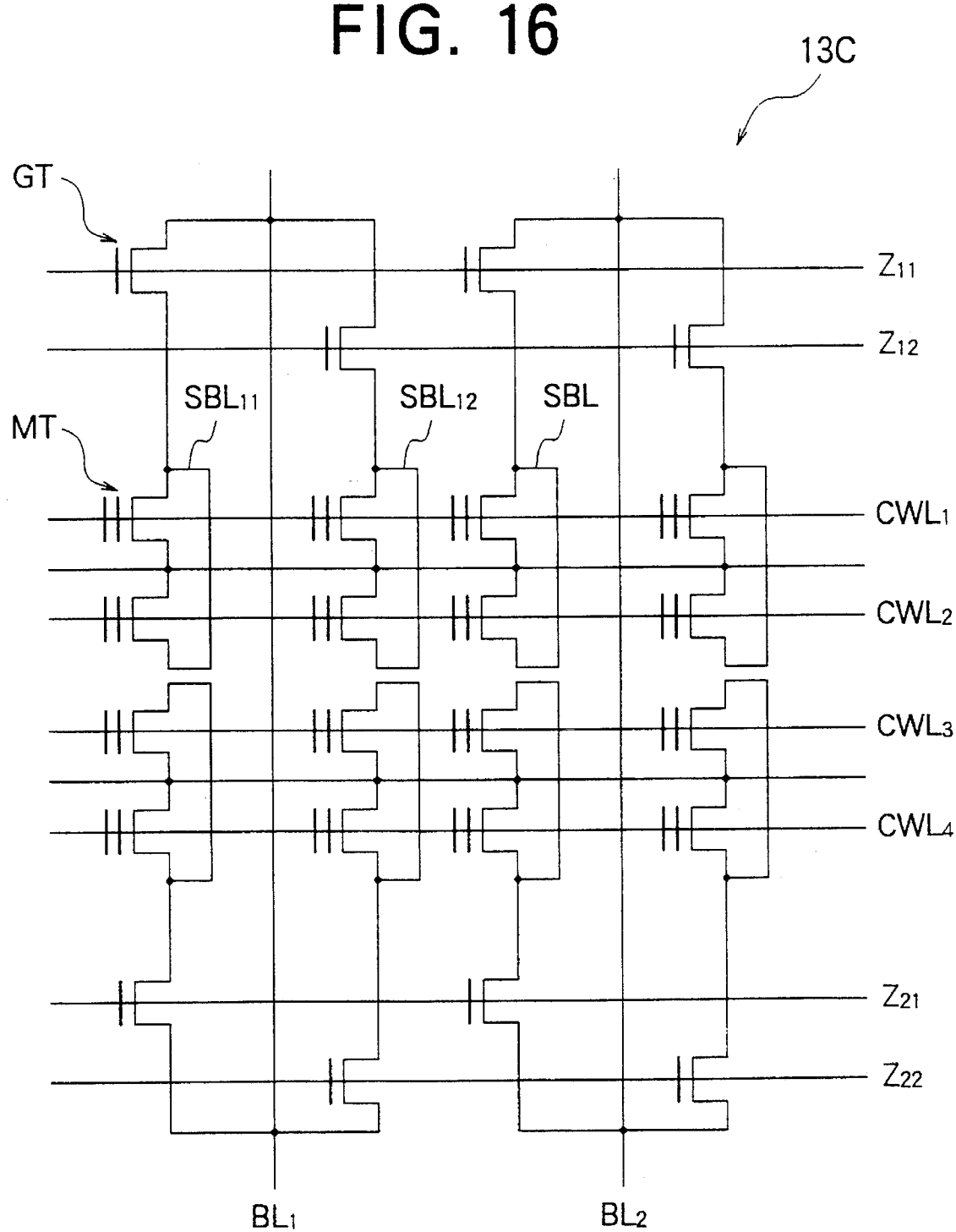
FIG. 16 is a circuit diagram of an example of the configuration of an auxiliary memory array in the case of the circuit of FIG. 15.

FIG. 15 is a circuit diagram of an example of the configuration of normal memory arrays 11-1 and 11-2 of FIG. 13 in the case of application of the present invention to a DINOR type flash EEPROM as a fourth embodiment; while FIG. 16 is a circuit diagram of an example of the configuration of an auxiliary memory array 13C in that case. In the figures, MT shows a memory transistor and GT a gate transistor.

This embodiment is an example of the case of word lines divided into four. The bit line $BL_1$ and the bit line $BL_2$ are made to correspond to the two bit lines $SBL_{11}$ and $SBL_{12}$ and the two bit lines $SBL_{21}$ and $SBL_{22}$, respectively, to reduce the number of the bit lines. By adopting this configuration, it is possible to reduce the density of defects in the pattern and possible to reduce the parasitic capacitance.

Figure 17:
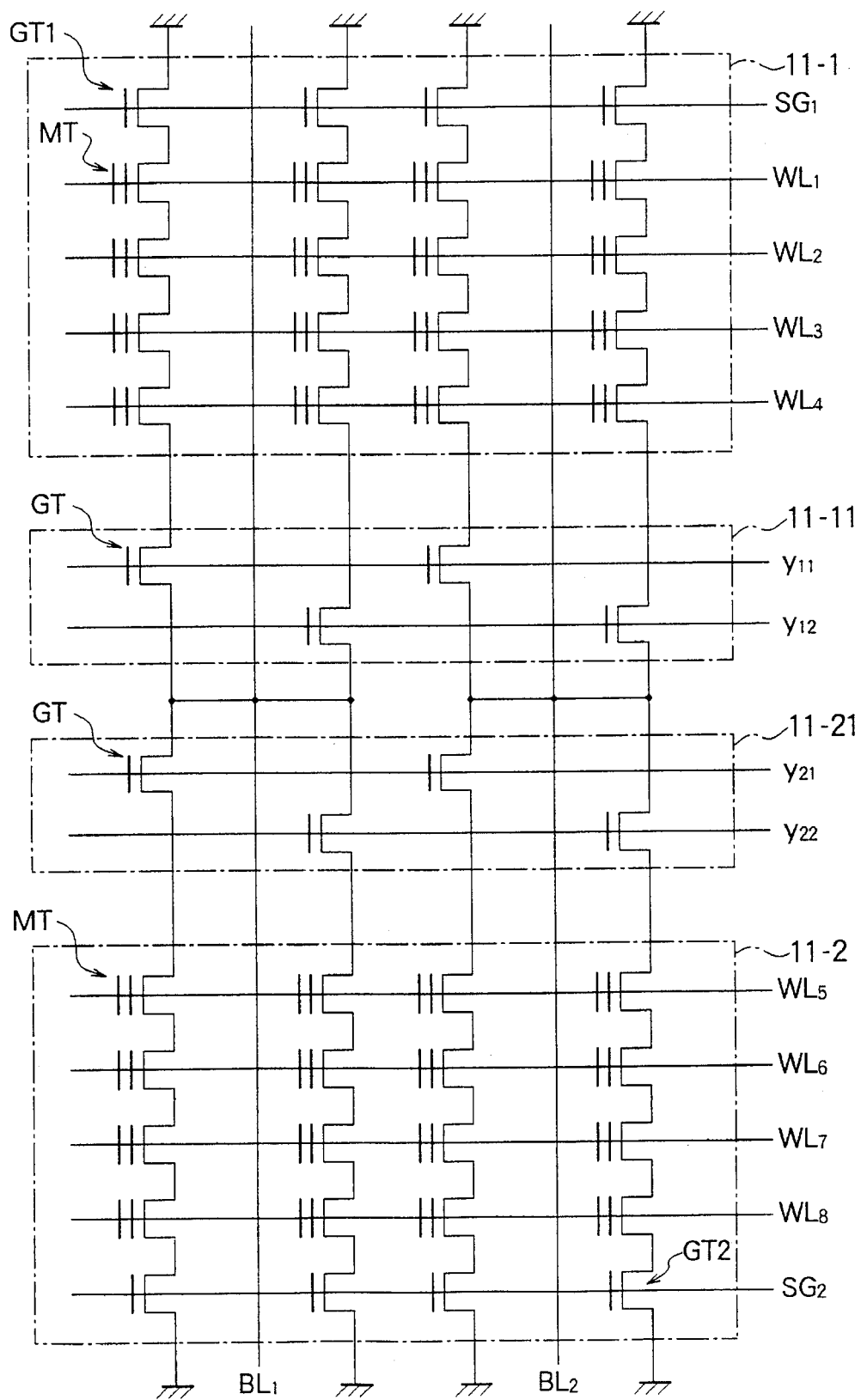
FIG. 17 is a circuit diagram of an example of the configuration of a normal memory array in the case of application of the present invention to an NAND type flash EEPROM as a fifth embodiment.

FIG. 17 is a circuit diagram of an example of the configuration of normal memory arrays 11-1 and 11-2 of FIG. 13 in the case of application of the present invention to an NAND type flash EEPROM as a fifth embodiment.

The point of difference from the memory cell array of the DINOR type flash EEPROM shown in FIG. 15 and FIG. 16 is that there are no sub-bit lines and that the gates $GT_1$ and $GT_2$ comprised of N-channel MOS transistors with gates connected to the input line of the selection gate signals $SG_1$ and $SG_2$ are provided at the side of the memory array facing the block selection gates 11-11 and 11-21.

Even in the case of use of a DINOR type flash EPROM and NAND type flash EEPROM, a similar effect can be obtained as in the above-mentioned NOR type flash EEPROM. Further, in the above-mentioned second and third embodiments, the explanation was made taking as an example the case of application of the present invention to an electrically rewritable semiconductor nonvolatile memory, but it is also possible to apply it to a mask programmable ROM in which the information for storage is written by the mask pattern in the process of production of the semiconductor for example.

In this case, when the number of the cells, out of the memory cells connected to the same bit line, in which the data "1" is recorded is greater than the number of cells in which the data "0" is recorded, the mask data is prepared by inverting the phase of the data for the cells connected to the same bit line and, when reading the data, inverting the read data and outputting the result.

Due to this, compared with the case where none of the measures spoken of in the present invention are taken, the amount of the data generated can be reduced to as much as half and the processing time required for fabrication of the mask can be reduced.

This processing time is not proportional to the amount of data. Considering the conversion of the data which is generated into raster scan data for electron beam drawing, the amount of data increases exponentially, so the effect of reduction of the amount of data is greater than the amount of reduction.

As explained above, according to the present invention, there are the advantages that the frequency of drain disturbances at the time of writing data can be tremendously reduced to less than half, the resistance to drain disturbances can be greatly improved, and destruction of data can be prevented.

Further, when used for a mask programmable ROM etc., the amount of the data generated can be reduced to as much as a half and the processing time required for the fabrication of the mask can be reduced.

What is claimed is:

1. A semiconductor nonvolatile memory which performs word line sector erasure, wherein a storing portion is provided for storing the number of cycles of rewriting and erasure for each word line and wherein a cumulative number of cycles of each word line is stored in said storing portion at each cycle of rewriting and erasure; and wherein said storing portion comprises a plurality of auxiliary bit lines provided so as to intersect said word lines and a plurality of auxiliary nonvolatile memory cells driven by the auxiliary bit lines and said word lines.

2. A semiconductor nonvolatile memory as set forth in claim 1, wherein the number (m) of said auxiliary bit lines and the number (m×number of word lines) of said auxiliary nonvolatile memory cells define the bit length of the cumulative number of cycles stored.

3. A semiconductor nonvolatile memory as set forth in claim 1, further comprising at least one redundant word line to which memory cells are connected in parallel and a circuit for cutting off a word line and replacing said word line by a redundant word line when said cumulative number of cycles of said word line stored in said storing portion reaches a preset value.

4. A semiconductor nonvolatile memory which performs word line sector erasure, wherein a storing portion is provided for storing the number of cycles of rewriting and erasure for each word line and wherein a cumulative number of cycles of each word line is stored in said storing portion at each cycle of rewriting and erasure; and further comprising at least one redundant word line to which memory cells are connected in parallel and a circuit for cutting off a word line and replacing said word line by a redundant word line when said cumulative number of cycles of the word line stored in said storing portion reaches a preset value.

* * * * *